(12) United States Patent
Lee et al.

(10) Patent No.: US 8,866,137 B2
(45) Date of Patent: Oct. 21, 2014

(54) THIN FILM TRANSISTOR ARRAY PANEL AND MANUFACTURING METHOD THEREOF

(75) Inventors: Jin-Won Lee, Cheonan-si (KR); Woo Geun Lee, Yongin-si (KR); Kap Soo Yoon, Seoul (KR); Ki-Won Kim, Suwon-si (KR); Hyun-Jung Lee, Dongducheon-si (KR); Hee-Jun Byeon, Suwon-si (KR); Ji-Soo Oh, Uiwang-si (KR)

(73) Assignee: Samsung Display Co., Ltd., Yongin (KR)

( * ) Notice: Subject to any disclaimer, the term of this patent is extended or adjusted under 35 U.S.C. 154(b) by 288 days.

(21) Appl. No.: 13/365,704

(22) Filed: Feb. 3, 2012

(65) Prior Publication Data

US 2012/0217493 A1     Aug. 30, 2012

(30) Foreign Application Priority Data

Feb. 25, 2011     (KR) ........................ 10-2011-0017062

(51) Int. Cl.
    *H01L 29/12*      (2006.01)
    *H01L 27/12*      (2006.01)
    *H01L 29/417*     (2006.01)

(52) U.S. Cl.
    CPC ....... *H01L 27/1225* (2013.01); *H01L 29/41733* (2013.01)
    USPC    257/43; 257/72; 257/E27.152; 257/E27.131; 257/E21.411; 438/34; 438/587; 438/608; 438/609

(58) Field of Classification Search
    CPC combination set(s) only.
    See application file for complete search history.

(56) References Cited

U.S. PATENT DOCUMENTS

| 2010/0127266 A1* | 5/2010 | Saito et al. ................... 257/59 |
| 2010/0207119 A1* | 8/2010 | Sakata et al. .................. 257/43 |
| 2011/0084267 A1* | 4/2011 | Yamazaki et al. ............. 257/43 |

* cited by examiner

*Primary Examiner* — Fei Fei Yeung Lopez
(74) *Attorney, Agent, or Firm* — H.C. Park & Associates, PLC

(57) ABSTRACT

A thin film transistor array panel includes: a gate electrode disposed on an insulation substrate; a gate insulating layer disposed on the gate electrode; a first electrode and an oxide semiconductor disposed directly on the gate insulating layer; a source electrode and a drain electrode formed on the oxide semiconductor; a passivation layer disposed on the first electrode, the source electrode, and the drain electrode; and a second electrode disposed on the passivation layer.

37 Claims, 14 Drawing Sheets

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2011-0017062, filed on Feb. 25, 2011, which is hereby incorporated by reference for all purposes as if fully set forth herein.

BACKGROUND OF THE INVENTION

1. Field of the Invention

Exemplary embodiments of the present invention relate to a thin film transistor array panel and a manufacturing method thereof.

2. Discussion of the Background

A liquid crystal display is currently one of the most widely used types of flat panel display. A liquid crystal display is a display device that includes two display panels, on which electrodes are formed, and a liquid crystal layer disposed therebetween. The intensity of transmitted light is controlled by rearranging liquid crystal molecules of the liquid crystal layer, by applying a voltage to the electrodes.

A thin film transistor (TFT) display panel that is one of the two display panels and is used as a circuit board for independently driving each pixel in a liquid crystal display. In general, the thin film transistor array panel includes a scanning signal wire or gate wire that transmits a scanning signal, an image signal line or data wire that transmits an image signal, a thin film transistor that is connected to the gate wire and the data wire, a pixel electrode that is connected to the thin film transistor, a gate insulating layer that covers and insulates the gate wire and insulates, and an interlayer insulating layer that covers and insulates the thin film transistor and the data wire. In this way, the thin film transistor array panel includes a plurality of layers that are patterned using a photosensitive film, through exposure and development processes.

When forming two or more electrodes on the same layer, an interval between the electrodes is increased to reduce signal interference between the electrodes. In this case, the transmittance of the liquid crystal display is decreased. Also, when forming the electrodes on the different layers, a separate photomask is used to form each electrode, such that the manufacturing cost is increased.

The above information disclosed in this Background section is only for enhancement of understanding of the background of the invention and, therefore, it may contain information that does not constitute prior art.

SUMMARY OF THE INVENTION

Exemplary embodiments of the present invention provide a thin film transistor array panel and a manufacturing method thereof that reduce a transmittance reduction of a liquid crystal display, by forming electrodes with a narrow interval therebetween, when forming two or more electrodes in one pixel area.

Exemplary embodiments of the present invention provide a thin film transistor array panel and a manufacturing method thereof that reduce manufacturing costs when forming two or more electrodes in one pixel area.

Additional features of the invention will be set forth in the description which follows, and in part will be apparent from the description, or may be learned by practice of the invention.

A thin film transistor array panel, according to an exemplary embodiment of the present invention, includes: a gate electrode disposed on an insulation substrate; a gate insulating layer disposed on the gate electrode; a first electrode and an oxide semiconductor disposed on the gate insulating layer; a source electrode and a drain electrode formed on the oxide semiconductor; a passivation layer disposed on the first electrode, the source electrode, and the drain electrode; and a second electrode disposed on the passivation layer.

An etch stopper disposed on the oxide semiconductor may be further included.

The oxide semiconductor that is not covered by the etch stopper and the first electrode may be treated with hydrogen plasma.

The oxide semiconductor may include indium-gallium-zinc oxide.

The first electrode and the second electrode may be sub-pixel electrodes disposed in one pixel area.

The first electrode and the second electrode may be applied with a data voltage.

The first electrode and the second electrode may be applied with the data voltages having different magnitudes and that are obtained from one image signal.

The first electrode may be a pixel electrode, and the second electrode may be a reference electrode.

The first electrode may be applied with a data voltage, and the second electrode may be applied with a reference voltage of a predetermined magnitude.

A manufacturing method of a thin film transistor array panel, according to an exemplary embodiment of the present invention, includes: forming a gate electrode on an insulation substrate; forming a gate insulating layer on the gate electrode; forming an oxide semiconductor and a first electrode on the gate insulating layer; forming a source electrode and a drain electrode on the oxide semiconductor; forming a passivation layer on the first electrode, the source electrode, and the drain electrode; and forming a second electrode on the passivation layer.

The method may further include forming an etch stopper on the oxide semiconductor, and treating the oxide semiconductor that is not covered by the etch stopper and the first electrode with hydrogen plasma.

In the thin film transistor array panel according to an exemplary embodiment of the present invention, one electrode layer of a plurality of electrodes disposed in one pixel area is formed at the same layer as the oxide semiconductor such that the electrode layers are disposed with different layers even though the interval between the electrodes is narrow, thereby reducing signal interference. Accordingly, the transmittance of light may be increased.

Also, the electrode layer and the oxide semiconductor are simultaneously formed, compared with a case that the electrode layer and the oxide semiconductor are separately formed, so the number of photomasks may be reduced and thereby the manufacturing cost may be reduced. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE EXEMPLARY EMBODIMENTS

Figure 1:
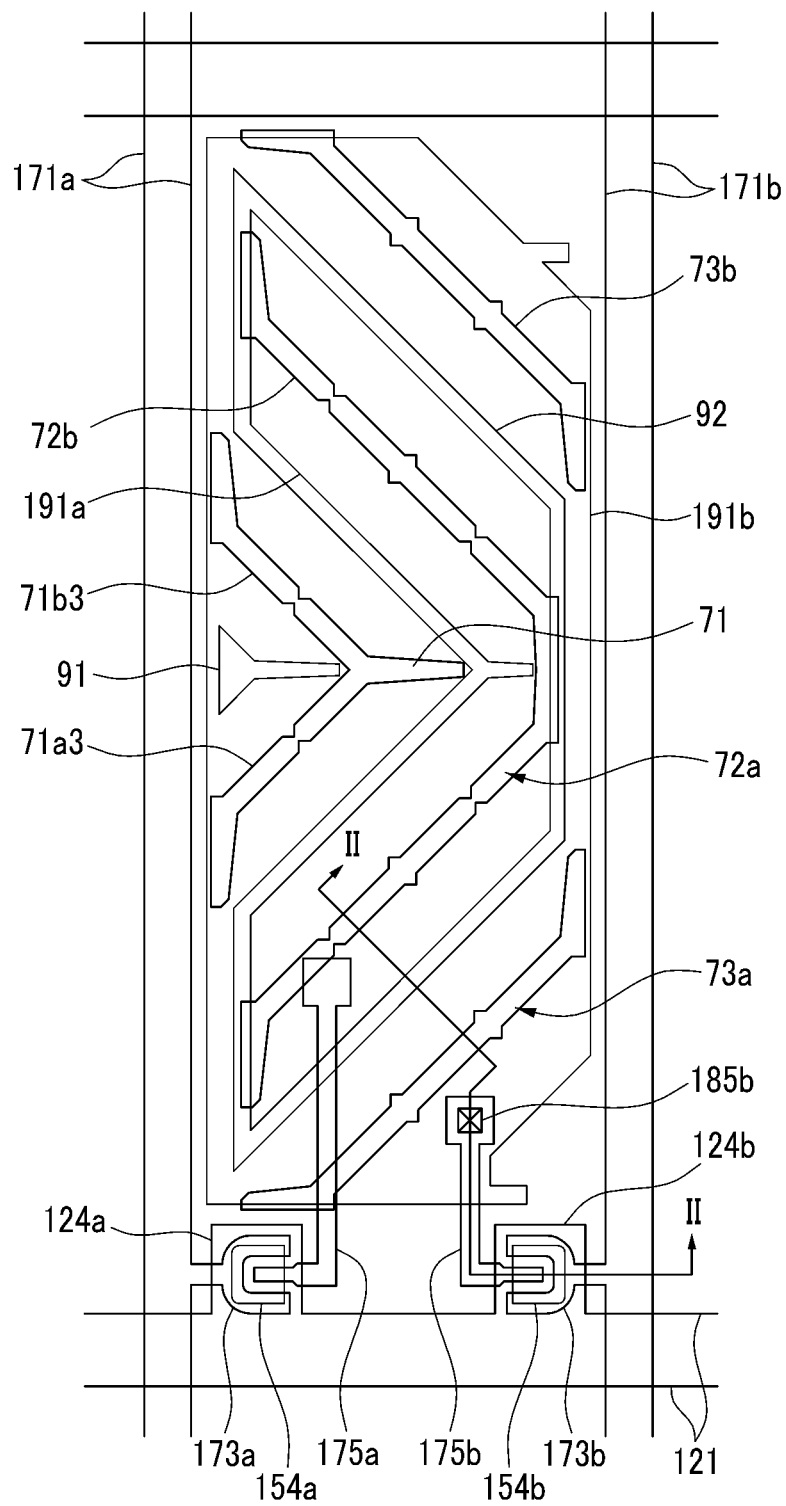
FIG. 1 is a layout view of a liquid crystal display including a thin film transistor array panel, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Firstly, a thin film transistor array panel, according to an exemplary embodiment of the present invention, will be described with reference to FIG. 1 and FIG. 2. FIG. 1 is a layout view of a liquid crystal display including a thin film transistor array panel 100, according to an exemplary embodiment of the present invention, and FIG. 2 is a cross-sectional view of the liquid crystal display of FIG. 1 taken along the line II-II.

Figure 2:
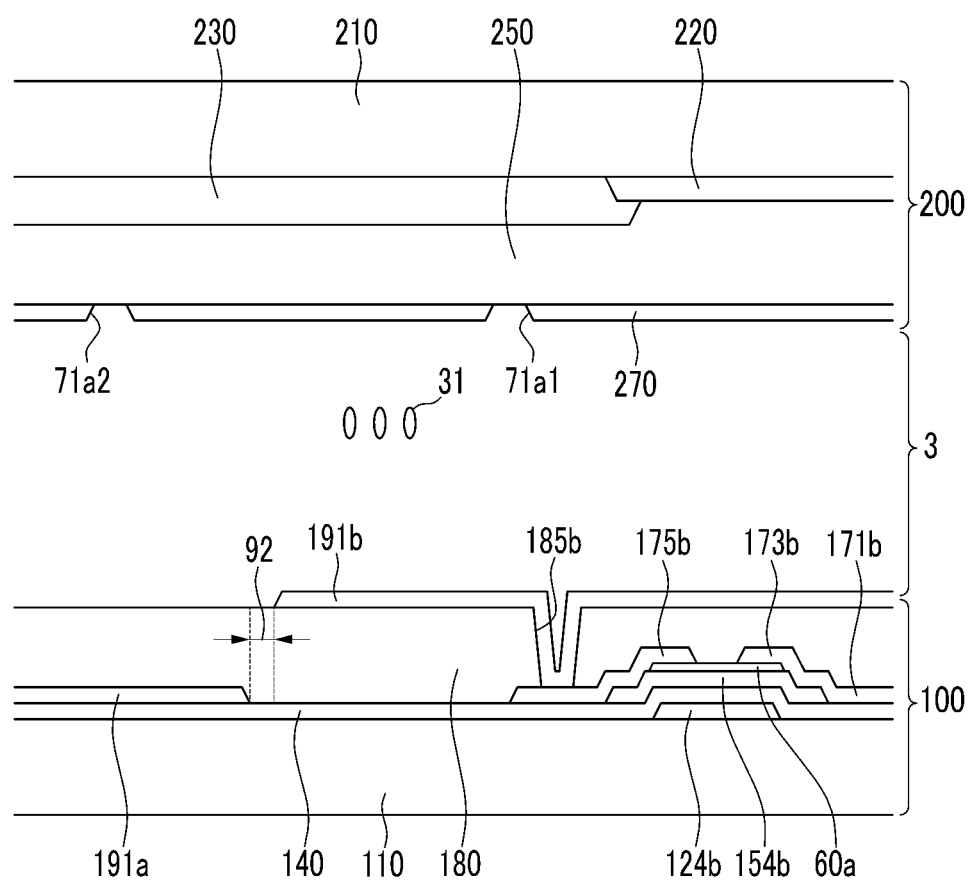
FIG. 2 is a cross-sectional view of the liquid crystal display of FIG. 1, taken along the line II-II.

Referring to FIG. 1 and FIG. 2, the liquid crystal display includes the thin film transistor array panel 100, an upper panel 200, and a liquid crystal layer 3 interposed between the two display panels 100 and 200. With regard to the thin film transistor array panel 100, gate lines 121 are formed on an insulation substrate 110 made of transparent glass or plastic. The gate line 121 transmits gate signals and extends in a transverse direction. Pairs of gate electrodes 124a and 124b protrude from the gate line 121. End portion (not shown) of the gate lines 121 may be used for connection with another layer or an external driving circuit. A gate insulating layer 140 made of silicon nitride ($SiN_x$) or silicon oxide ($SiO_x$) is formed on the gate line 121.

Pairs of oxide semiconductors 154a and 154b and first pixel electrodes 191a are formed on the gate insulating layer 140. The oxide semiconductors 154a and 154b include an oxide of zinc (Zn), gallium (Ga), tin (Sn), or indium (In). For example, the oxide semiconductors 154a and 154b may include zinc oxide (ZnO), indium-gallium-zinc oxide (InGaZnO$_4$), indium-zinc oxide (Zn—In—O), or zinc-tin oxide (Zn—Sn—O). In detail, the oxide semiconductors 154a and 154b may be indium-gallium-zinc oxide. According to some embodiments, the oxide semiconductors 154a and 154b may be formed directly on the gate insulting layer 140. The first pixel electrode 191a may be formed on the same layer as the oxide semiconductors 154a and 154b. In detail, the first pixel electrode 191a may include indium-gallium-zinc oxide. According to some embodiments, the first pixel electrode 191a may be formed directly on the gate insulating layer 140.

An etch stopper 60a is formed on each of the oxide semiconductors 154a and 154b. The etch stopper 60a is made of silicon nitride, and covers the channel of the semiconductors 154a and 154b, to prevent the channel from being damaged by an etchant.

Pairs of data lines 171a and 171b and pairs of a first drain electrode 175a and a second drain electrode 175b are formed on the etch stopper 60a and portions of the semiconductors 154a and 154b that are not covered by the etch stopper 60a. The data lines 171a and 171b include a first source electrode 173a and a second source electrode 173b having a "U" shape that curves toward the first gate electrode 124a and the second gate electrode 124b, respectively. The first source electrode 173a and the second source electrode 173b respectively face the first drain electrode 175a and the second drain electrode 175b, with respect to the first gate electrode 124a and the second gate electrode 124b.

The first drain electrode 175a and the second drain electrode 175b have ends that are enclosed by the first source electrode 173a and the second source electrode 173b, respectively, and have opposing ends that have a wide area for connection with another layer. However, the shapes and arrangements of the data lines 171a and 171b as well as the first and second drain electrodes 175a and 175b may be modified in various forms.

The first gate electrode 124a, the first source electrode 173a, and the first drain electrode 175a form the first thin film transistor, along with the first semiconductor 154a. The channel of the first thin film transistor is formed in the first semiconductor 154a, between the first source electrode 173a and the first drain electrode 175a. Similarly, the second gate electrode 124b, the second source electrode 173b, and the second drain electrode 175b form the second thin film transistor, along with the second semiconductor 154b. The channel of the second thin film transistor is formed in the second semiconductor 154b, between the second source electrode 173b and the second drain electrode 175b.

An expansion of the first drain electrode 175a extends on the first pixel electrode 191a and directly contacts the first pixel electrode 191a. A passivation layer 180 made of silicon nitride or silicon oxide is formed on the data lines 171a and 171b, the drain electrodes 175a and 175b, and the etch stopper 60a.

However, the passivation layer 180 may be made of an organic insulator and may have a planarized surface. The passivation layer 180 has a plurality of contact holes 185b exposing the second drain electrode 175b.

The second pixel electrode 191b is formed on the passivation layer 180. The second pixel electrode 191b may be made of a transparent conductive material, such as ITO or IZO. The first pixel electrode 191a directly contacts the first drain electrode 175a, thereby receiving a data voltage from the first drain electrode 175a. The second pixel electrode 191b is connected to the second drain electrode 175b through the contact hole 185b, thereby receiving the data voltage from the second drain electrode 175b.

The first pixel electrode 191a and the second pixel electrode 191b are separated via a gap 92. The gap 92 represents a horizontal separation distance. Since the first pixel electrode 191a and the second pixel electrode 191b are formed on opposing sides of the passivation layer 180, even though the width of the gap 92 between two electrodes 191a and 191b is narrow, signal interference between the two electrodes 191a and 191b is relatively small. By forming the two electrodes 191a and 191b on different layers, although the width of the gap 92 between the two electrodes 191a and 191b is narrow, the influence of the signal interference between the two electrodes 191a and 191b may be decreased, and the transmittance of the liquid crystal display may be increased.

The first pixel electrode 191a and the second pixel electrode 191b may be applied with different data voltages that are previously set for one input image signal. The magnitude thereof may be set according to sizes and shapes of the electrodes 191a and 191b. The areas of the electrodes 191a and 191b may be different from each other. For example, the second pixel electrode 191b may be supplied with a higher voltage than the first pixel electrode 191a, and the area of the second pixel electrode 191b may be smaller than that of the first pixel electrode 191a.

Referring to the upper panel 200, a light blocking member 220 is formed on an insulation substrate 210 made of transparent glass or plastic. The light blocking member 220 is referred to as a black matrix and prevents light leakage between the first pixel electrodes 191a. The light blocking member 220 has a plurality of openings (not shown) facing the first pixel electrode 191a and having the same approximate shape as the first pixel electrode 191a. However, the light blocking member 220 includes a portion corresponding to the gate line 121 and the data lines 171a and 171b, and a portion corresponding to the thin film transistor.

A plurality of color filters 230 are formed on the substrate 210. The color filters 230 are mostly disposed within the areas surrounded by the light blocking member 220, and may longitudinally extend along the columns of the first electrode 191a. Each of the color filters 230 may express a primary color such as red, green, and blue.

An overcoat 250 is formed on the color filter 230 and the light blocking member 220. The overcoat 250 prevents the color filters 230 from being exposed and provides a flat surface for forming the color filters 230 and the light blocking member 220. The overcoat 250 may be omitted.

A common electrode 270 is formed on the overcoat 250. The common electrode 270 is made of the transparent conductor, such as ITO and IZO. The common electrode 270 has cutouts 71, 71a1, 71a2, 71a3, 71b3, 72a 72b, 73a, and 73b.

The edges of the electrodes 191a and 191b, the gap 92 between the electrodes 191a and 191b, and the cutouts of the common electrode 270 divide the pixel area into a plurality of sub-areas, and each sub-area has two primary edges forming an oblique angle, along with the primary edge of the first pixel electrode 191a. Liquid crystal molecules 31 of each sub-area are mainly inclined in a direction perpendicular to the adjacent primary edge, and hence, approximately four inclination directions are formed. As the inclination directions of the liquid crystal molecules are diversified, the reference viewing angle of the liquid crystal display increases.

Figure 3:
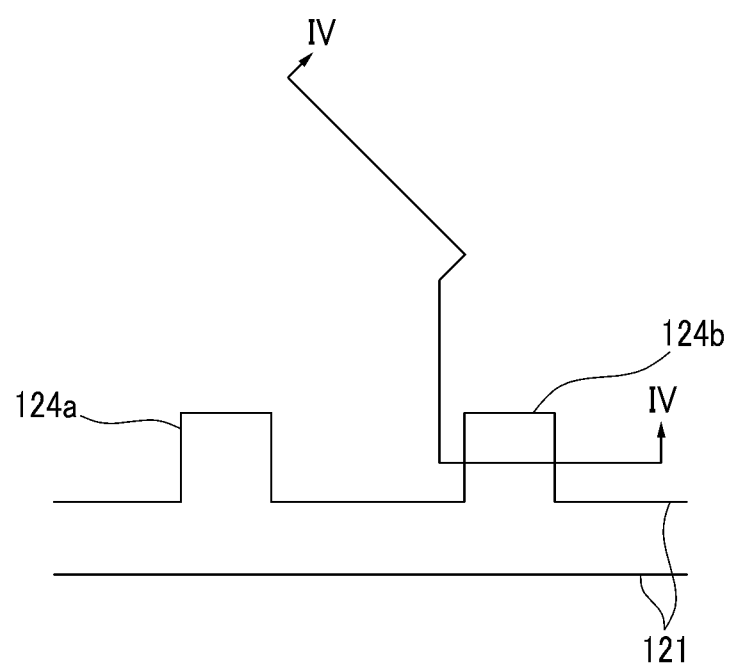
FIG. 3, FIG. 5, FIG. 8, and FIG. 10 are layout views sequentially showing a manufacturing method of the thin film transistor array panel shown in FIG. 1 and FIG. 2.
Figure 4:
FIG. 4 is a cross-sectional view of the thin film transistor array panel shown in FIG. 3, taken along the line IV-IV.
Figure 5:
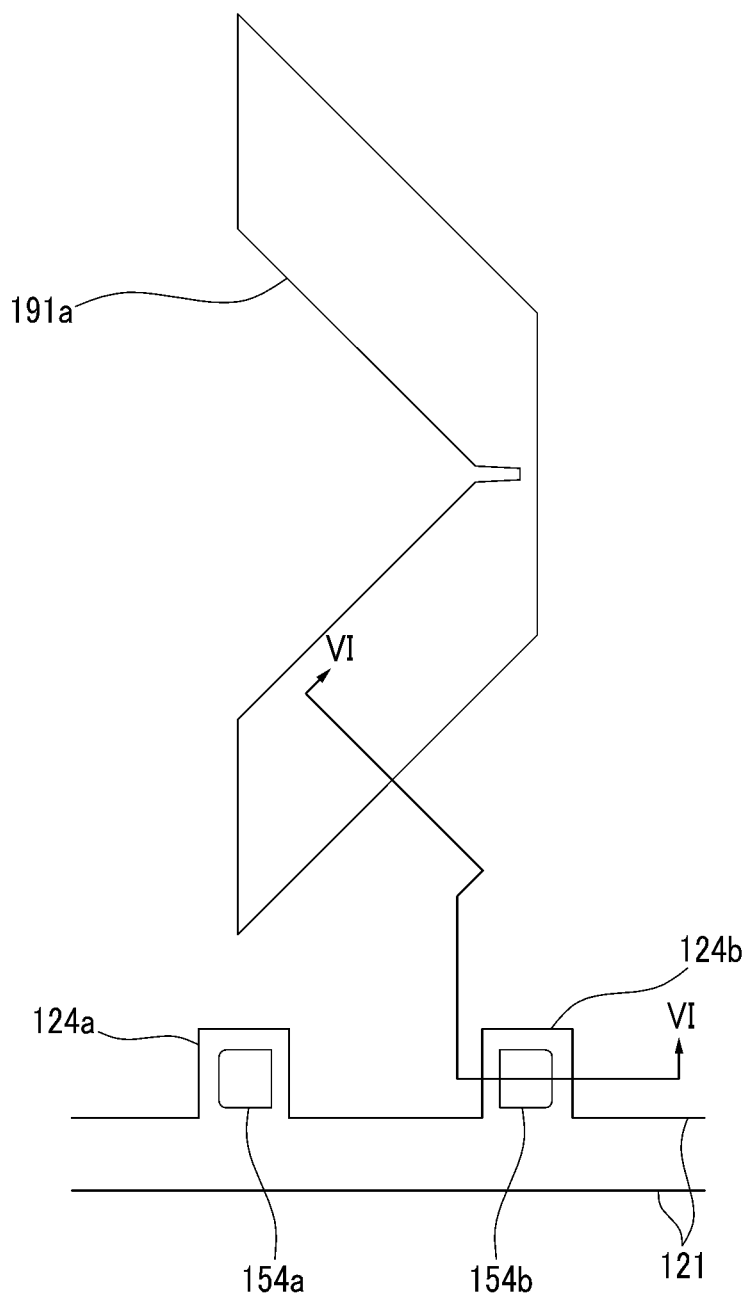
Figure 6:
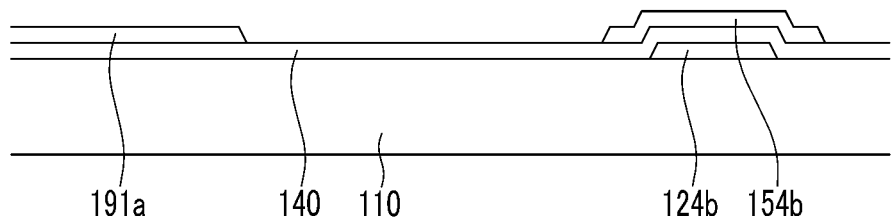
FIG. 6 is a cross-sectional view of the thin film transistor array panel shown in FIG. 5, taken along the line VI-VI.

FIG. 3, FIG. 5, FIG. 8, and FIG. 10 are layout views sequentially showing a manufacturing method of the thin film transistor array panel shown in FIG. 1 and FIG. 2, FIG. 4 is a cross-sectional view of the thin film transistor array panel shown in FIG. 3, taken along the line IV-IV. FIG. 6 is a cross-sectional view of the thin film transistor array panel shown in FIG. 5, taken along the line VI-VI. FIG. 7A to FIG. 7D are cross-sectional views sequentially showing a manufacturing method of the thin film transistor array panel shown in FIG. 5 and FIG. 6. FIG. 9 is a cross-sectional view of the thin film transistor array panel shown in FIG. 8, taken along the line IX-IX. FIG. 11 is a cross-sectional view of the thin film transistor array panel shown in FIG. 10, taken along the line XI-XI.

Referring to FIG. 3 and FIG. 4, a metal layer is formed on an insulation substrate 110 made of transparent glass or plastic and is patterned to form a gate line 121 having gate electrodes 124a and 124b. Next, as shown in FIG. 5 and FIG. 6, a gate insulating layer 140 is deposited on the gate line 121, and the semiconductors 154a and 154b and the first pixel electrode 191a are formed on the gate insulating layer 140.

Figure 7A:
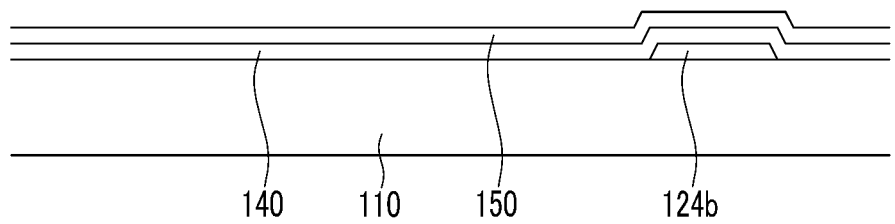
FIG. 7A to FIG. 7D are cross-sectional views sequentially showing a manufacturing method of the thin film transistor array panel shown in FIG. 5 and FIG. 6.
Figure 7B:
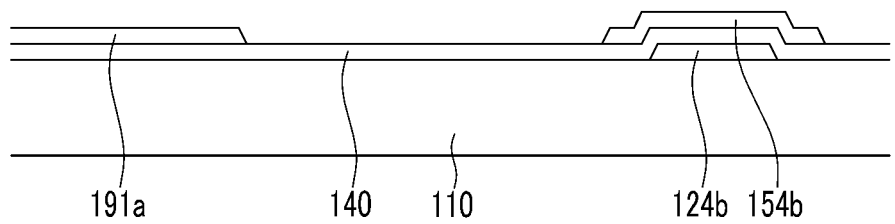
Figure 7C:
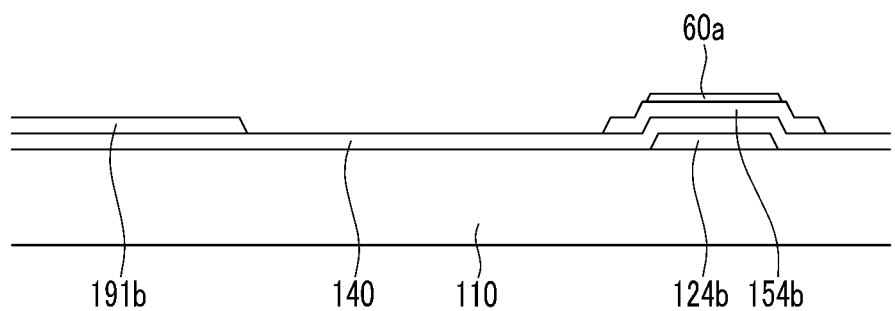

Referring to FIG. 7A, an oxide semiconductor layer 150 is formed on the gate insulating layer 140. Next, as shown in FIG. 7B, an oxide semiconductor layer 150 is patterned through photolithography to form a semiconductor 154b and the first pixel electrode 191a. Next, as shown in FIG. 7C, an etch stopper 60a is formed on the semiconductor 154b.

Figure 7D:
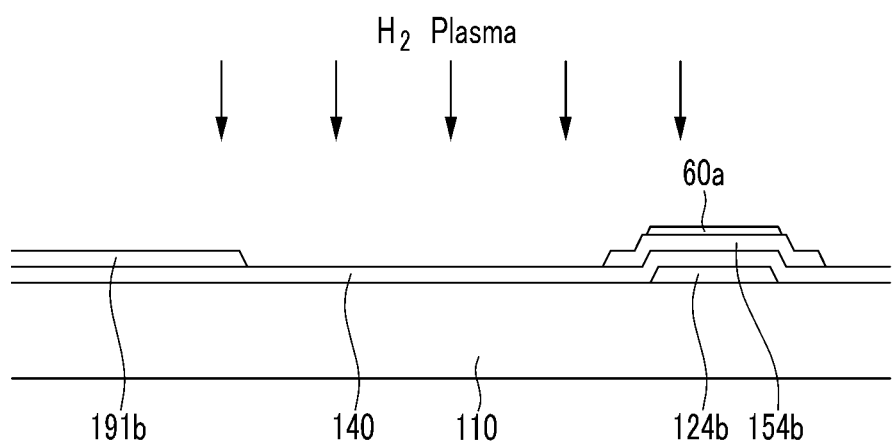

Finally, as shown in FIG. 7D, plasma treatment of hydrogen ($H_2$) is used to increase conductivity of the first pixel electrode 191a. Here, the oxide semiconductor 154b in which the channel of the thin film transistor is formed is covered by the etch stopper 60a to be protected. Thus, the hydrogen plasma does not affect the channel of the oxide semiconductor 154b.

The conductivity of the first pixel electrode 191a is similar to a case that the transparent electrode is formed by using conventional IZO, due to the hydrogen plasma treatment. Table 1 below shows charge mobility and electron carrier concentration of the first pixel electrode 191a, after various hydrogen plasma treatments.

TABLE 1

| Plasma treatment condition | | | Mobility | | Electron carrier concentration | |
| --- | --- | --- | --- | --- | --- | --- |
| Time | Power | Temp | Center | Edge | Center | Edge |
| 10 s | 1000 W | 280° C. | 8.92 | 16.2 | −9.399E+19 | −1.324E+20 |
| 10 s | 150 W | 280° C. | 15.5 | 17.3 | −1.461E+20 | −1.466E+20 |
| 60 s | 1000 W | 280° C. | 1.48 | 2.22 | −1.595E+19 | −4.103E+19 |
| 60 s | 1000 W | 370° C. | 2.37 | 3.68 | −3.918E+19 | −3.918E+19 |

When forming the transparent electrode by using IZO in the same condition, the mobility is about 11.4 and the electron carrier concentration is about −1.20 E+16. As shown in Table 1, in an exemplary embodiment of the present invention, when the hydrogen plasma treatment is executed after forming the first pixel electrode 191a with the oxide semiconductor layer, the first pixel electrode 191a may have a charge mobility and electron carrier concentration similar to the conventional IZO electrode. Particularly, in the above two cases in which hydrogen plasma treatment is executed for about 10 seconds, it is confirmed that the first pixel electrode 191a may have a charge mobility and electron carrier concentration similar to the conventional IZO electrode.

Figure 8:
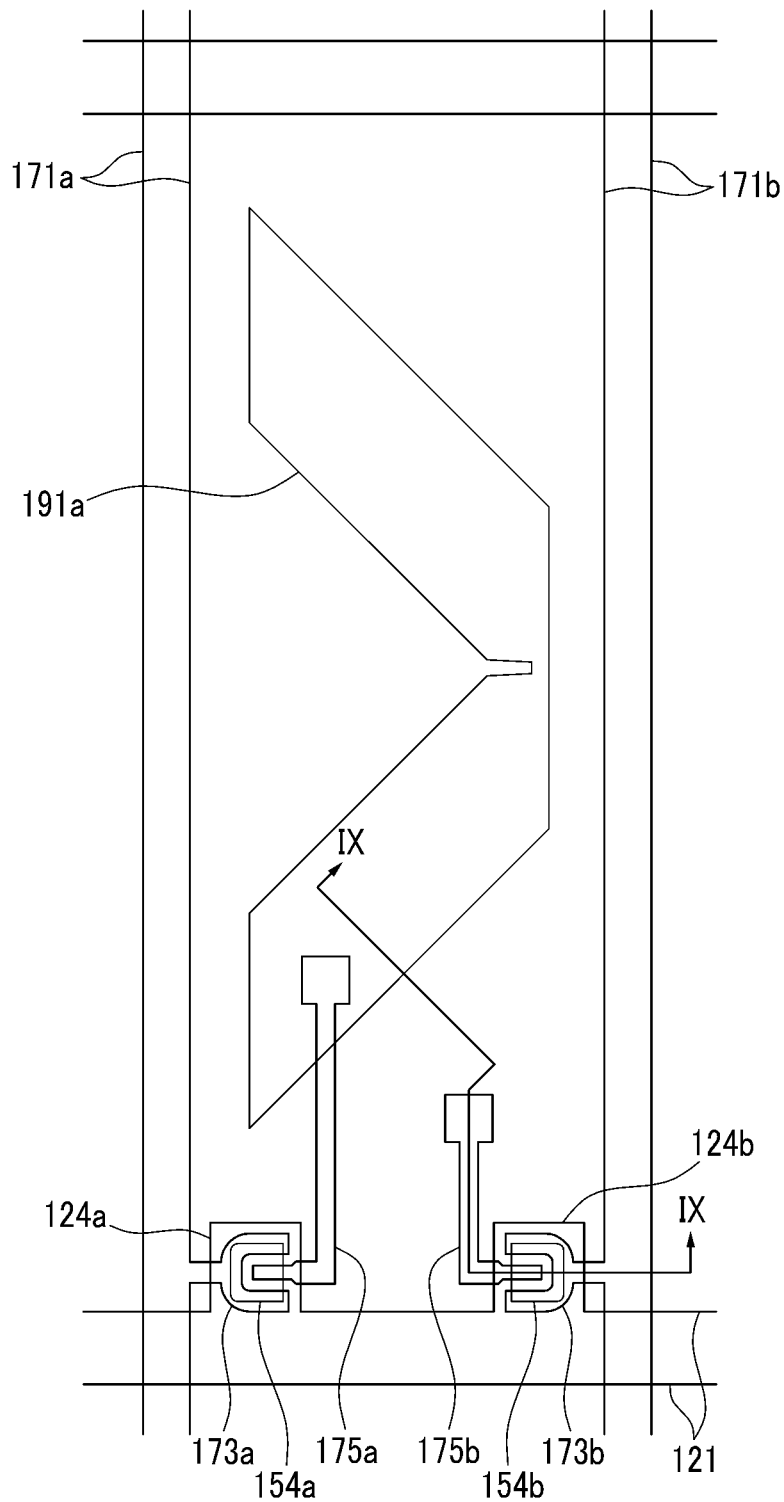
Figure 9:
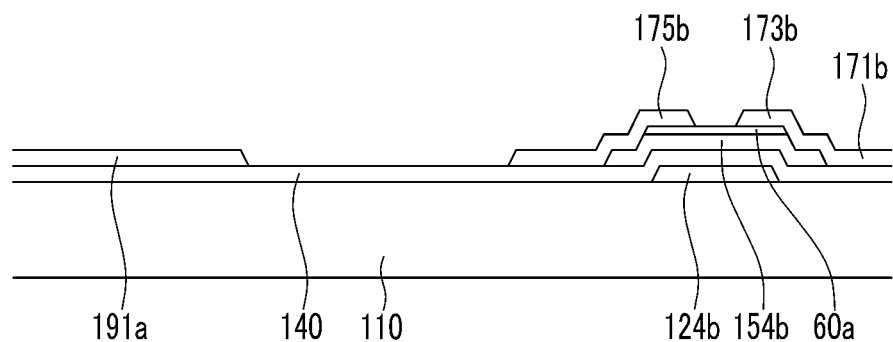
FIG. 9 is a cross-sectional view of the thin film transistor array panel shown in FIG. 8, taken along the line IX-IX.

Next, as shown in FIG. 8 and FIG. 9, pairs of data lines 171a and 171b including pairs of source electrodes 173a and 173b and pairs of a first drain electrode 175a and a second drain electrode 175b are formed on the etch stopper 60a and the areas of the semiconductors 154a and 154b that are not covered by the etch stopper 60a.

Figure 10:
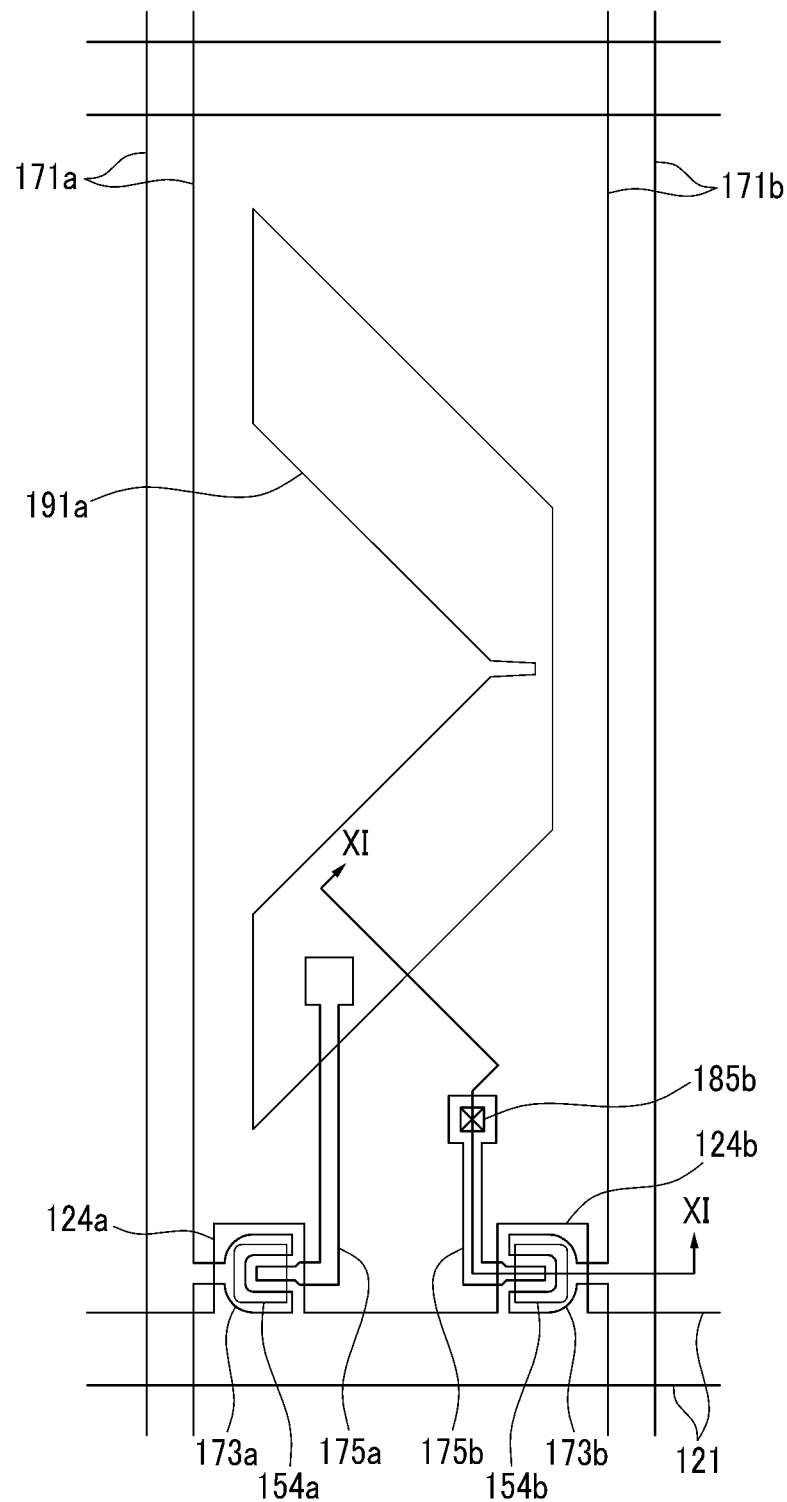
Figure 11:
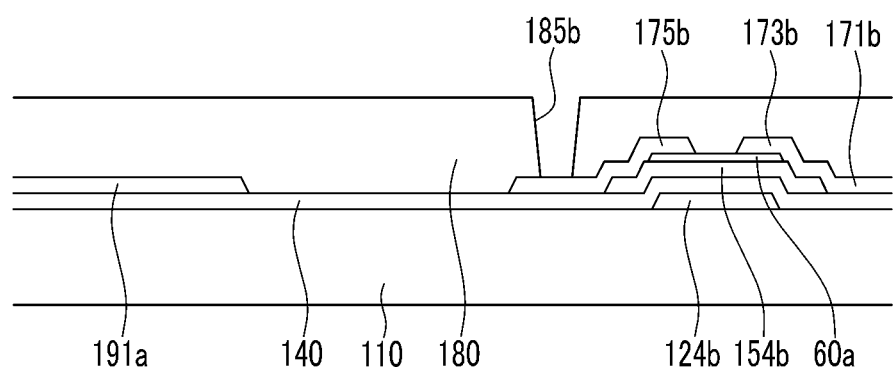
FIG. 11 is a cross-sectional view of the thin film transistor array panel shown in FIG. 10, taken along the line XI-XI.

Next, as shown in FIG. 10 and FIG. 11, a passivation layer 180 is deposited and patterned to form a contact hole 185b exposing the second drain electrode 175b. Finally, as shown in FIG. 1 and FIG. 2, the second pixel electrode 191b is formed on the passivation layer 180.

In this way, according to the exemplary manufacturing method, the first pixel electrode 191a is formed along with the oxide semiconductors 154a and 154b. When disposing two or more electrodes in one pixel area, the plane interval between the electrodes may be reduced, thereby increasing transmittance.

Figure 12:
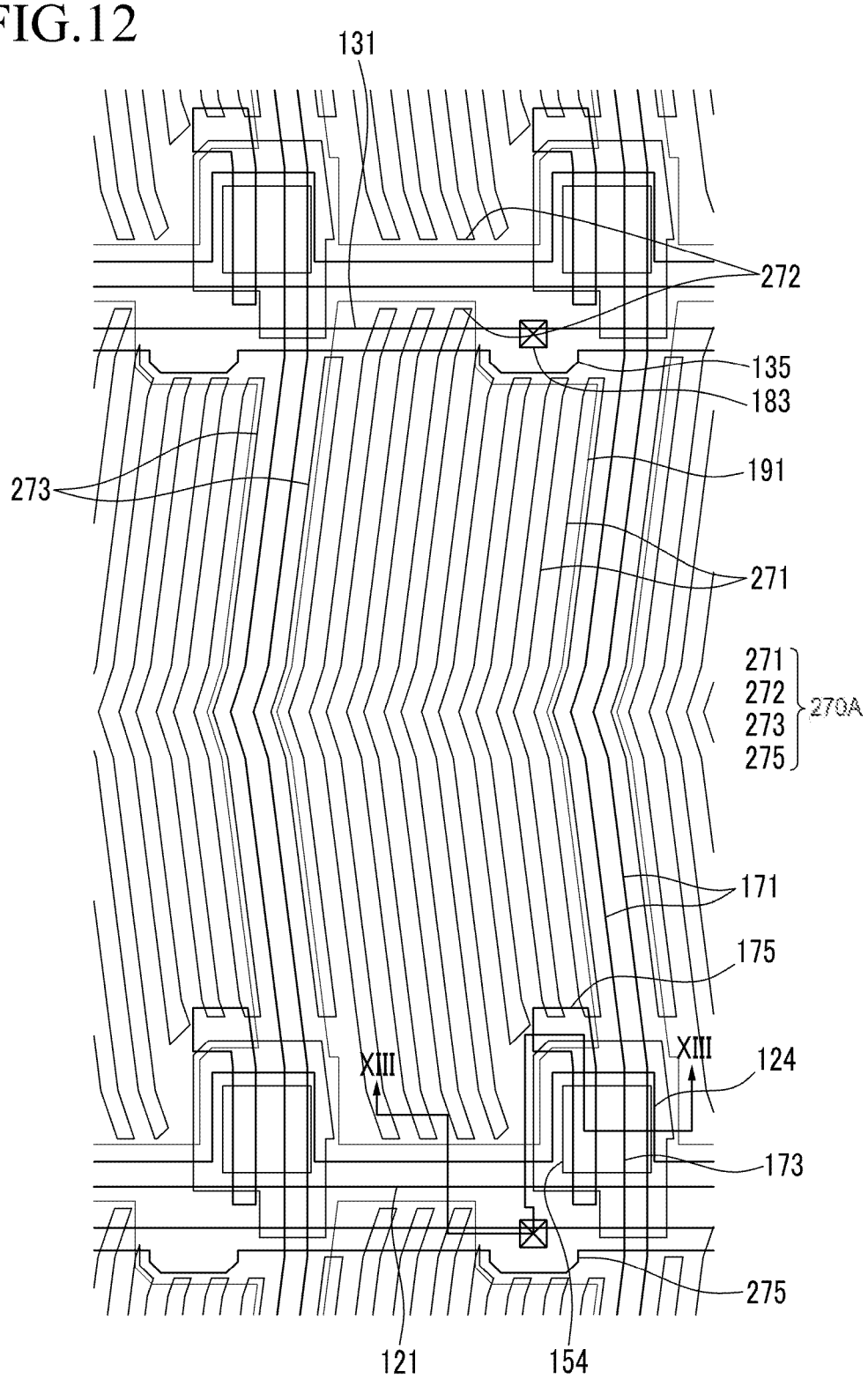
FIG. 12 is a layout view of a liquid crystal display including a thin film transistor array panel, according to another exemplary embodiment of the present invention.
Figure 13:
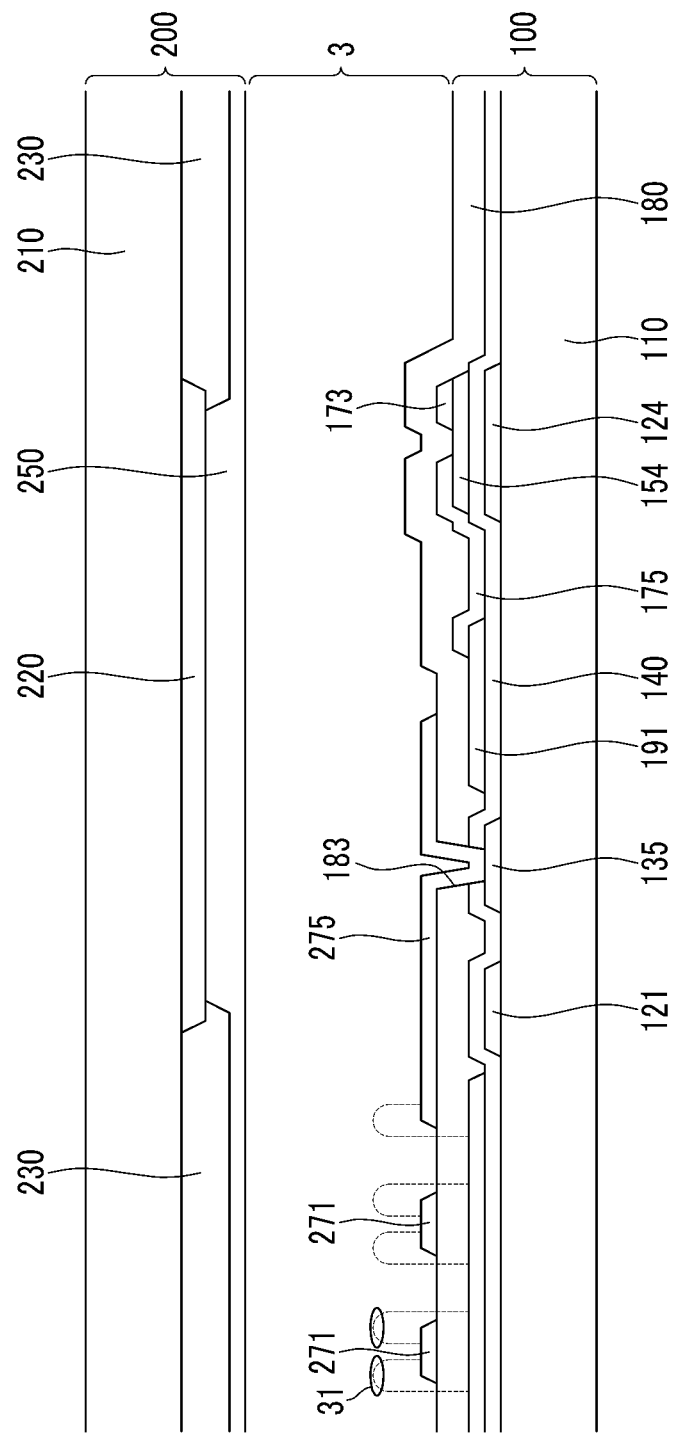
FIG. 13 is a cross-sectional view of the liquid crystal display of FIG. 12 taken along the line XIII-XIII.

FIG. 12 is a layout view of a liquid crystal display including a thin film transistor array panel, according to an exemplary embodiment of the present invention, and FIG. 13 is a cross-sectional view of the liquid crystal display of FIG. 12, taken along the line XIII-XIII. Referring to FIG. 12 and FIG. 13, the liquid crystal display includes a thin film transistor array panel 100, an upper panel 200, and a liquid crystal layer 3 interposed between the two display panels 100 and 200.

With regard to the thin film transistor array panel 100, a gate conductor including a gate line 121 and a reference voltage line 131 is formed on an insulation substrate 110 made of transparent glass or plastic. The gate line 121 includes a gate electrode 124 and an end portion (not shown) for connection with another layer or an external driving circuit. The gate line 121 may be made aluminum (Al), an aluminum alloy, silver (Ag), a silver alloy, copper (Cu), a copper alloy, molybdenum (Mo), a molybdenum alloy, chromium (Cr), tantalum (Ta), or titanium (Ti). The gate line 121, however, may have a multilayer structure including at least two conductive layers having different physical properties.

The reference voltage line 131 transmits a predetermined reference voltage, and has an extender 135 for connection with a second transparent electrode 270a. The reference voltage line 131 is connected with the second transparent electrode 270a and transmits a reference voltage to the second electrode 270a. The reference voltage line 131 may be parallel with the gate line 121 and may be made of the same material as the gate line 121.

A gate insulating layer 140 made of silicon nitride ($SiN_x$) or silicon oxide ($SiO_x$) is formed on the gate conductors 121 and 131. The gate insulating layer 140 may have a multilayer structure including at least two insulating layers having different physical properties.

An oxide semiconductor 154 and a first electrode 191 are formed on the gate insulating layer 140. The oxide semiconductor 154 and the first electrode 191 may be made from the same layer of material, and in detail, may be made of indium-gallium-zinc oxide. An etch stopper is formed on the oxide semiconductor 154. A data conductor including a data line 171 including a source electrode 173 and a drain electrode 175 is formed on the etch stopper and the oxide semiconductor 154.

The data line 171 includes a wide end portion (not shown) for connection with another layer or an external driving circuit. The data line 171 transmits data signals and intersects the gate line 121 and the reference voltage line 131. The data line 171 and the gate line 121 at least partially define a pixel area. The first data line 171 may have a first bend to improve the transmittance of the liquid crystal layer. The bend form a V-shape at the intermediate area of the pixel area. The intermediate area of the pixel area may further include a second bend forming an angle with the first bend.

The source electrode 173 is a portion of the data line 171 and is disposed parallel to the data line 171. The drain electrode 175 extends parallel with the source electrode 173. Therefore, the drain electrode 175 is parallel with a portion of the data line 171. The drain electrode 175 covers a portion of the first electrode 191, thereby directly contacting the first electrode 191, so as to be physically and electrically connected thereto.

The gate electrode 124, the source electrode 173, and the drain electrode 175 constitute one thin film transistor (TFT), together with the semiconductor island 154. The channel of the thin film transistor is formed in the semiconductor 154, between the source electrode 173 and the drain electrode 175.

Since the liquid crystal display includes the source electrode 173 in the same line as the data line 171, and the drain electrode 175 extending parallel with the data line 171, it is possible to increase the width of the thin film transistor, without increasing the area of the data conductor. As such, the aperture ratio of the liquid crystal display can be increased.

The data line 171 and the drain electrode 175 may be made of a refractory metal such as molybdenum, chromium, tantalum, and titanium, or alloys thereof, and may have a multilayer structure (not shown) including a refractory metal layer and a low-resistance conductive layer. The multilayer structure, for example, may be a double layer of a chromium or molybdenum (alloy) lower layer and an aluminum (alloy) upper layer, or a triple layer of a molybdenum (alloy) lower layer, an aluminum (alloy) intermediate layer, and a molybdenum (alloy) upper layer. However, the data line 171 and the drain electrode 175 may be made of metals and conductors other than the above. The width of the data line 171 may be about 3.51μm±0.75.

The first electrode 191 includes a curved edge approximately parallel to the first bend and the second bend of the data line 171. A passivation layer 180 is formed on the data conductors 171 and 175, the etch stopper, and the first electrode 191. The passivation layer 180 is made of an inorganic insulator, such as silicon nitride and silicon oxide. The passivation layer 180 has a contact hole (not shown) exposing the end portion of the data line 171. The passivation layer 180 and the gate insulating layer 140 have a contact hole 183 exposing the extender 135 of the reference voltage line 131 and a contact hole (not shown) exposing the end portion of the gate line 121.

The second electrode 270a is formed on the passivation layer 180. The second electrode 270a overlaps the first electrode 191, and includes branch electrodes 271, a transverse connection 272 connecting the branch electrodes 271, and a longitudinal connection 273 connecting the transverse connection 272. The second electrode 270a is made of a transparent conductive material, such as poly-crystalline, mono-crystalline, or amorphous indium tin oxide (ITO) or indium zinc oxide (IZO). The second electrodes 270a disposed in adjacent pixels are connected to each other.

The transverse connection 272 of the second electrode 270a is almost parallel to the gate line 121 and connects the branch electrodes 271 up and down. The transverse connection 272 of the second electrode 270a disposed lower in the pixel area has a first opening 274 exposing a portion of the gate electrode 124, the semiconductor 154, the data line 171 forming the source electrode 173, the drain electrode 175 forming the thin film transistor, and the reference voltage line 131. The transverse connection 272 of the second electrode 270a has an extender 275 extending toward the extender 135 of the reference voltage line 131. The second electrodes 270a disposed in adjacent pixels are connected to each other. The longitudinal connection 273 of the second electrode 270a extends on the data line 171, is disposed between two adjacent pixels, and has the first opening 274 disposed on a portion of the data line 171.

The extender 275 of the second electrode 270a is physically and electrically connected to the reference voltage line 131, through the contact hole 183 of the passivation layer 180 and the gate insulating layer 140. Although not shown, an alignment layer is formed on the second electrode 270a and passivation layer 180, the alignment layer may be a horizontal alignment layer, and it may be rubbed in a predetermined direction. The rubbing direction of the alignment layer may form an angle of about 5° to 10° along the direction of the branch electrode 271 mainly extends, and in detail, about 7°.

With regard to the upper panel 200, a light blocking member 220 is formed an insulation substrate 210 made of transparent glass or plastic. A plurality of color filters 230 are formed on the substrate 210. Most of the color filters 230 are disposed in the region enclosed by the light blocking member 220, and may extend in the longitudinal direction, according to the column of the first electrodes 191. An overcoat 250 is formed on the color filters 230 and the light blocking member 220. The overcoat 250 may be made of an inorganic or organic insulator, prevents the color filters 230 from being exposed and provides a planarized surface. The overcoat 250 may be omitted.

The liquid crystal layer 3 includes a nematic liquid crystal material having positive dielectric anisotropy. Liquid crystal molecules 31 of the liquid crystal layer 3 are arranged such that their longer axes are parallel to the display panels 100 and 200, and they are spirally twisted by 90°, starting from the rubbing direction of the alignment layer of the lower panel 100, to reach the upper display panel 200.

The first electrode 191 receives a data voltage from the drain electrode 175, and the second electrode 270a receives a reference voltage of a predetermined magnitude from the reference voltage line 131. The second electrodes 270a receive the reference voltage from a reference voltage application unit disposed outside of the display area. However, to prevent a voltage drop in the display area, the second electrodes 270 receive the reference voltage having the same magnitude from the reference voltage line 131.

The first electrode 191, to which a data voltage is applied, and the second electrode 270a, to which the reference voltage is applied, generate an electric field, and the liquid crystal molecules 31 that are positioned adjacent to the two electrodes 191 and 270 are rotated in a direction parallel to the field lines of the electric field. The polarization of light that passes through the liquid crystal layer changes, depending on the rotation direction of the liquid crystal molecules.

As described above, the liquid crystal molecules 31 are rotated by the electric field formed between the edges of the branch electrodes 271 and the first electrode 191. Here, in the liquid crystal display, the alignment layer pretilts the liquid crystal molecules 31 at a predetermined angle of about 5° to 10°. In detail, the liquid crystal molecules may be pretilted at an angle of about 7°, with respect to the branch electrodes 271, such that the liquid crystal molecules may be quickly rotated in the pretilt direction, when the electric field is applied.

The first electrode 191 is disposed between the gate insulating layer 140 and the passivation layer 180, and covers a portion of the drain electrode 175, so as to be directly physically and electrically connected thereto. As such, the aperture ratio is increased, as compared with a conventional liquid crystal display.

Also, since the present liquid crystal display includes the source electrode 173 in the same line with the data line 171 and the drain electrode 175 extending in parallel with the data line 171, it is possible to increase the width of the thin film transistor, without increasing the area of the data conductor, such that the aperture ratio of the liquid crystal display can be increased.

Also, in the present liquid crystal display, the second electrode 270 has the first opening 274 exposing a portion of the gate electrode 124, the semiconductor island 154, the data line 171 having the source electrode 173 forming the thin film transistor, and the drain electrode 175, thereby reducing parasitic capacitance between the data line 171 and the second electrode 270a. Also, one of two electrodes 191 and 270a is formed from the same material layer as the oxide semiconductor 154, such that the manufacturing process of the liquid crystal display may be simplified, and the manufacturing cost may be reduced.

In the above exemplary embodiment, the first electrode has a sheet shape without an additional pattern in the pixel area, and the first electrode includes the plurality of linear branch electrodes and a branch electrode connection connecting the same. However, the present invention is not limited thereto. That is, the second electrode may have a sheet shape without an additional pattern in the pixel area, and the first transparent electrode may include a plurality of linear branch electrodes and a branch electrode connection connecting the same. Also, the present invention may be applied to all cases in which the color filter and the blocking film are formed on the insulation substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising: a gate electrode disposed on a substrate; a gate insulating layer disposed on the gate electrode; a first electrode and an oxide semiconductor disposed on the gate insulating layer4Nith the same layer ; a source electrode and a drain electrode disposed on the oxide semiconductor; a passivation layer disposed on the first electrode, the source electrode, and the drain electrode; and a second electrode disposed on the passivation layer, wherein the entirety of both the first electrode and the second electrode are disposed in one pixel area defined by two data lines and two gate lines [of the substrate] and are completely spaced apart from one another by the passivation layer.

2. The thin film transistor array panel of claim 1, further comprising an etch stopper disposed on the oxide semiconductor.

3. The thin film transistor array panel of claim 2, wherein the first electrode and a portion of the oxide semiconductor that is not covered by the etch stopper comprise hydrogen plasma-treated surfaces.

4. The thin film transistor array panel of claim 3, wherein the oxide semiconductor comprises indium-gallium-zinc oxide.

5. The thin film transistor array panel of claim 4, wherein:
the first electrode and the oxide semiconductor are disposed directly on the gate insulating layer; and
the second electrode is formed directly on the passivation layer and does not overlap with the first electrode in a direction perpendicular to the plane of the substrate.

6. The thin film transistor array panel of claim 1, wherein the first electrode and the second electrode are sub-pixel electrodes applied with data voltages.

7. The thin film transistor array panel of claim 1, wherein the first electrode and the second electrode are applied with data voltages having different magnitudes and that are obtained from one image signal.

8. The thin film transistor array panel of claim 4, wherein:
the first electrode is a pixel electrode; and
the second electrode is a reference electrode.

9. The thin film transistor array panel of claim 8, wherein:
the first electrode is applied with a data voltage; and
the second electrode is applied with a reference voltage.

10. The thin film transistor array panel of claim 1, wherein portions of the oxide semiconductor and the first electrode comprise hydrogen plasma-treated surfaces.

11. The thin film transistor array panel of claim 10, wherein the oxide semiconductor comprises indium-gallium-zinc oxide 12. The thin film transistor array panel of claim 11, wherein the first electrode and the second electrode are sub-pixel electrodes.

13. The thin film transistor array panel of claim 12, wherein the first electrode and the second electrode are applied with data voltages.

14. The thin film transistor array panel of claim 13, wherein the first electrode and the second electrode are applied with data voltages having different magnitudes and are obtained from one image signal.

15. The thin film transistor array panel of claim 11, wherein:
the first electrode is a pixel electrode; and
the second electrode is a reference electrode.

16. The thin film transistor array panel of claim 15, wherein:
the first electrode is applied with a data voltage; and
the second electrode is applied with a reference voltage.

17. The thin film transistor array panel of claim 1, wherein the oxide semiconductor and the first electrode comprise indium-gallium-zinc oxide.

18. The thin film transistor array panel of claim 17, wherein the first electrode and the second electrode are sub-pixel electrodes.

19. The thin film transistor array panel of claim 18, wherein the first electrode and the second electrode are applied with data voltages.

20. The thin film transistor array panel of claim 19, wherein the data voltages of the first electrode and the second electrode have different magnitudes and are obtained from one image signal.

21. The thin film transistor array panel of claim 18, wherein:
the first electrode is a pixel electrode; and
the second electrode is a reference electrode.

22. The thin film transistor array panel of claim 21, wherein:
the first electrode is applied with a data voltage; and
the second electrode is applied with a reference voltage.

23. The thin film transistor array panel of claim 1, wherein the first electrode and the second electrode are sub-pixel electrodes.

24. The thin film transistor array panel of claim 23, wherein the first electrode and the second electrode are applied with data voltages.

25. The thin film transistor array panel of claim 24, wherein the data voltages of the first electrode and the second electrode have different magnitudes and are obtained from one image signal.

26. The thin film transistor array panel of claim 1, wherein:
the first electrode is a pixel electrode; and
the second electrode is a reference electrode.

27. The thin film transistor array panel of claim 26, wherein:
the first electrode is applied with a data voltage; and
the second electrode is applied with a reference voltage.

28. A method for manufacturing a thin film transistor array panel, comprising: forming a gate electrode on a substrate; forming a gate insulating layer on the gate electrode; forming an oxide semiconductor and a first electrode on the gate insulating layer, by patterning an oxide semiconductor material layer; forming a source electrode and a drain electrode on the oxide semiconductor; forming a passivation layer on the first electrode, the source electrode, and the drain electrode; and forming a second electrode on the passivation layer, wherein the entirety of both the first electrode and the second electrode are disposed in one pixel area defined by two data lines and two gate lines [of the substrate] and are completely spaced apart from one another by the passivation layer.

29. The method of claim 28, further comprising:
forming an etch stopper on the oxide semiconductor; and
treating a portion of the oxide semiconductor that is not covered by the etch stopper and is not covered by the first electrode with hydrogen plasma.

30. The method of claim 29, wherein: the oxide semiconductor comprises indium-gallium-zinc oxide.

31. The method of claim 30, wherein the first electrode and the second electrode are sub-pixel electrodes.

32. The method of claim 30, wherein:
the first electrode is a pixel electrode; and
the second electrode is a reference electrode.

33. The method of claim 28, wherein the oxide semiconductor comprises indium-gallium-zinc oxide.

34. The method of claim 28, wherein: the oxide semiconductor and the first electrode are formed directly on the gate insulating layer; and
the second electrode is formed directly on the passivation layer and does not overlap with the first electrode in a direction perpendicular to the plane of the substrate.

35. The method of claim 33, wherein:
the first electrode is a pixel electrode; and
the second electrode is a reference electrode.

36. The method of claim 28, wherein the first electrode and the second electrode are sub-pixel electrodes.

37. The method of claim 28, wherein:
the first electrode is a pixel electrode; and
the second electrode is a reference electrode.

* * * * *